(12) United States Patent
Strangman (10) Patent No.: US 10,722,946 B2
(45) Date of Patent: Jul. 28, 2020

(54) METHODS OF FABRICATING TURBINE ENGINE COMPONENTS

(71) Applicant: Thomas Strangman, Prescott, AZ (US)

(72) Inventor: Thomas Strangman, Prescott, AZ (US)

( * ) Notice: Subject to any disclaimer, the term of this patent is extended or adjusted under 35 U.S.C. 154(b) by 630 days.

(21) Appl. No.: 15/137,300

(22) Filed: Apr. 25, 2016

(65) Prior Publication Data

US 2017/0304900 A1    Oct. 26, 2017

(51) Int. Cl.
  B22F 5/00    (2006.01)
  C30B 11/00   (2006.01)
  (Continued)

(52) U.S. Cl.
  CPC .......... *B22F 3/24* (2013.01); *B22F 3/008* (2013.01); *B22F 3/1055* (2013.01); *B22F 3/15* (2013.01); *B22F 5/009* (2013.01); *B22F 5/04* (2013.01); *B23K 26/342* (2015.10); *C22F 1/10* (2013.01); *C30B 11/003* (2013.01); *C30B 29/52* (2013.01); *B22F 2003/247* (2013.01); *B22F 2003/248* (2013.01); *B22F 2998/10* (2013.01);
  (Continued)

(58) Field of Classification Search
  None
  See application file for complete search history.

(56) References Cited

U.S. PATENT DOCUMENTS 4,820,356 A * 4/1989 Blackburn ............... C22F 1/10
                                            148/410
4,975,124 A  12/1990 Ault
(Continued)

FOREIGN PATENT DOCUMENTS

EP    2586887 A1    5/2013
WO    2015108599 A2  7/2015
(Continued)

OTHER PUBLICATIONS

Extended European Search Report dated Oct. 9, 2017 in corresponding European Patent Application No. 17162405.9, 10 pages.

*Primary Examiner* — Paul A Wartalowicz
*Assistant Examiner* — Stephani Hill
(74) *Attorney, Agent, or Firm* — Carter, DeLuca & Farrell LLP (57) ABSTRACT

Methods are provided that include depositing a nickel-base superalloy powder including gamma nickel solid solution and gamma prime ($Ni_3Al$) solid solution phases onto a seed crystal having a predetermined primary orientation, fully melting the powder and a portion of the seed crystal at a superliquidus temperature to form an initial layer having the predetermined primary orientation, heat treating the layer at subsolvus temperatures to precipitate gamma prime solid solution phase particles, depositing additional powder over the layer, melting the deposited powder and a portion of the initial layer at a superliquidus temperature to form a successive layer having the predetermined primary orientation, heat treating the layer at a subsolvus temperature to precipitate gamma prime solid solution phase particles, and repeating depositing additional powder, melting the additional powder and the portion of the successive layer at the superliquidus temperature, and heat treating the successive layer at a subsolvus temperature.

16 Claims, 6 Drawing Sheets

(51) Int. Cl.

| | | |
|---|---|---|
| *C30B 29/52* | (2006.01) | |
| *B22F 3/105* | (2006.01) | |
| *B22F 5/04* | (2006.01) | |
| *C22F 1/10* | (2006.01) | |
| *C22C 1/04* | (2006.01) | |
| *B33Y 10/00* | (2015.01) | |
| *B22F 3/24* | (2006.01) | |
| *B22F 3/15* | (2006.01) | |
| *B23K 26/342* | (2014.01) | |
| *B22F 3/00* | (2006.01) | |
| *B23K 101/00* | (2006.01) | |
| *B23K 103/08* | (2006.01) | |
| *B33Y 80/00* | (2015.01) | |

(52) U.S. Cl.
 CPC .... *B23K 2101/001* (2018.08); *B23K 2103/08* (2018.08); *B33Y 10/00* (2014.12); *B33Y 80/00* (2014.12); *C22C 1/0433* (2013.01); *Y02P 10/295* (2015.11)

(56) References Cited

U.S. PATENT DOCUMENTS

| | | |
|---|---|---|
| 5,047,091 A | 9/1991 | Khan et al. |
| 5,156,697 A | 10/1992 | Bourell et al. |
| 5,352,405 A | 10/1994 | Beaman et al. |
| 5,453,329 A | 9/1995 | Everett et al. |
| 5,837,960 A | 11/1998 | Lewis et al. |
| 6,024,792 A | 2/2000 | Kurz et al. |
| 6,103,402 A | 8/2000 | Marcin, Jr. et al. |
| 6,122,564 A | 9/2000 | Koch et al. |
| 6,495,793 B2 | 12/2002 | Tewari |
| 6,811,744 B2 | 11/2004 | Keicher et al. |
| 6,815,636 B2 | 11/2004 | Chung et al. |
| 7,452,500 B2 | 11/2008 | Uckelmann |
| 7,521,017 B2 | 4/2009 | Kunze et al. |
| 7,586,061 B2 | 9/2009 | Hoebel et al. |
| 8,728,388 B2 | 5/2014 | Morris et al. |
| 2007/0227630 A1* | 10/2007 | Augustins Lecallier ............ C22C 1/0433 148/428 |
| 2008/0135530 A1 | 6/2008 | Lee et al. |
| 2009/0206065 A1 | 8/2009 | Kruth et al. |
| 2011/0135952 A1 | 6/2011 | Morris et al. |
| 2013/0071562 A1* | 3/2013 | Szuromi ............... B22F 3/1055 427/237 |
| 2015/0064048 A1* | 3/2015 | Bessac ..................... B22F 3/24 419/29 |
| 2015/0132601 A1* | 5/2015 | Bruck .................. C23C 24/106 428/615 |
| 2016/0288266 A1* | 10/2016 | Rockstroh ............ B22F 3/1055 |
| 2016/0348216 A1* | 12/2016 | Szuromi ................... C22F 1/10 |
| 2017/0314114 A1* | 11/2017 | Ozbaysal ............ C22C 19/057 |

FOREIGN PATENT DOCUMENTS

| | | |
|---|---|---|
| WO | 2015109102 A1 | 7/2015 |
| WO | 2015119692 A2 | 8/2015 |

* cited by examiner

METHODS OF FABRICATING TURBINE ENGINE COMPONENTS

BACKGROUND

Technical Field

The present disclosure generally relates to engines, and more particularly relates to turbine components for engines and methods for fabricating the turbine components.

Description of Related Art

Gas turbine engines are used in a wide range of applications, such as propulsion engines and auxiliary power unit engines for aircraft. Typically, gas turbine engines include a turbine section having alternating stator airfoils and rotor blades on turbine disks disposed axially along a hot gas flow path. The hot gas impinges upon the rotor blades thereby spinning the disks to draw air into the engine to form combustion gases. The combustion gases are expelled from the engine to thereby create thrust for the aircraft and/or power various components of the aircraft.

The stator airfoils and rotor blades of a gas turbine engine typically have complex geometry with generally concave pressure sides and generally convex suction sides extending axially in chords between opposite leading and trailing edges. Aerodynamic contours of the stator airfoils and rotor blades, and corresponding flow passages between them, are configured in an attempt to maximize energy extraction from the combustion gases. Since higher engine efficiencies may occur at higher temperatures, some turbine components may additionally include internal cooling passages to enable such high temperature operation.

Given these considerations, turbine components may have relatively complex three-dimensional (3D) geometries that may raise difficult fabrication issues, when using conventional fabricating techniques such as forging, casting, and/or machining. For example, in one conventional casting process, a ceramic core is assembled into a wax tool that will provide the external shape of the component, the core is encased in wax, a ceramic shell is formed around the wax pattern, and the wax is removed to form a ceramic mold. Molten metal is then poured into the molds, cooled and solidified, and then the external shell and internal core are suitably removed to result in the desired turbine component. The cast turbine component may then undergo subsequent manufacturing processes such as heat treatment, machining, electrical discharge machining (EDM) or laser drilling, and coating with environmentally protective coatings. However, such fabrication processes are not only expensive but they also have long lead-times and may additionally have low yields. Development time and cost for cast turbine components may also be magnified because such components generally require several iterations.

SUMMARY

Methods are provided for fabricating a component having a directionally solidified microstructure or a single crystal microstructure.

According to an aspect of the present disclosure, a method includes depositing a nickel-base superalloy powder with a composition comprising gamma nickel solid solution and gamma prime ($Ni_3Al$) solid solution phases onto a seed crystal, the seed crystal having a predetermined primary orientation. The deposited nickel-base superalloy powder and a portion of the seed crystal are fully melted at a superliquidus temperature to form an initial layer, the initial layer having the predetermined primary orientation. The method also includes heat treating the deposited layer at subsolvus temperatures to precipitate particles of the gamma prime solid solution phase, depositing additional nickel-base superalloy powder over the initial layer, melting the deposited additional nickel-base superalloy powder and a portion of the initial layer at a superliquidus temperature to form a successive layer, the successive layer having the predetermined primary orientation, heat treating the successive layer at a subsolvus temperature to precipitate particles of the gamma prime solid solution phase, and repeating the steps of depositing additional nickel-base superalloy powder, melting the deposited additional nickel-base superalloy powder and the portion of the successive layer at the superliquidus temperature, and heat treating the successive layer at a subsolvus temperature to form the component.

In another aspect of the present disclosure, the method also includes a total thickness of the successive layer being in a range of about 15 microns to about 50 microns.

In still another aspect of the present disclosure, the method further includes at least partially melting the deposited nickel-base superalloy powder and bonding the deposited nickel-base superalloy powder to the seed crystal, before fully melting the deposited nickel-base superalloy powder and the portion of the seed crystal at the superliquidus temperature to form the initial layer. In another aspect of the present disclosure, the method includes at least partially melting the deposited additional nickel-base superalloy powder to bond it to the initial layer, before melting the deposited additional nickel-base superalloy powder and the portion of the initial layer at a superliquidus temperature to form the successive layer.

In another aspect of the present disclosure, the nickel-base superalloy comprises about 50% to about 70% gamma prime solid solution phase by volume.

In still another aspect of the present disclosure, the steps of melting the deposited nickel-base superalloy powder at a superliquidus temperature and heat treating the deposited layer at a subsolvus temperature are performed using a laser beam or an electron beam.

In yet another aspect of the present disclosure, a thickness of a layer of the deposited additional metal powder is in a range of about 15 microns to about 30 microns.

In still yet another aspect of the present disclosure, the seed crystal comprises a single crystal superalloy seed and has a predetermined secondary orientation that is orthogonal relative to the predetermined primary orientation, and the successive layer comprises a single grain and has the predetermined primary orientation and the predetermined secondary orientation, after the step of scanning the additional pattern at a superliquidus temperature.

In another aspect of the present disclosure, the component is hot isostatically pressed at a subsolvus temperature.

In still another aspect of the present disclosure, the hot isostatic pressing parameters include subsolvus temperatures in the range of 1000° C. to 1280° C., pressure is in the range of 1 to 25 ksi, and time in the range of 1 to 10 hours.

In still another aspect of the present disclosure, the component is further improved by surface finishing operations that remove up to 30 microns from external and internal surfaces. In another aspect of the present disclosure, the method further includes subjecting the component to a solution and precipitation heat treatments to impart an improved distribution of gamma prime particles within the gamma-gamma prime microstructure of the component.

In another aspect of the present disclosure, the method also includes depositing a coating over the surfaces of the component.

According to another aspect, a turbine engine component formed according to the methods described herein is provided.

Any of the above aspects and embodiments of the present disclosure may be combined without departing from the scope of the present disclosure.

BRIEF DESCRIPTION OF THE DRAWINGS

Various aspects and features of the present disclosure are described hereinbelow with references to the drawings, wherein.

DETAILED DESCRIPTION

Methods of fabricating a component, such as a turbine engine component, made from a nickel-base superalloy including gamma (nickel solid solution) and gamma prime ($Ni_3Al$ solid solution) phases and having a directionally solidified microstructure or a single crystal microstructure are provided. In an embodiment, the nickel-base superalloys comprise 50 to 70% gamma prime phase. Generally, the method comprises additive manufacturing and includes depositing a thin (for example, about 25 microns) layer metal powder over a seed crystal, the seed crystal having a predetermined primary orientation (typically, [001]), scanning an initial pattern into the deposited metal powder with a laser beam to at least partially melt or sinter at least a portion of the deposited metal powder, re-scanning the initial pattern with the laser beam set to completely melt the deposited metal powder and a portion of the seed crystal at superliquidus (above the liquidus) temperatures to form an initial layer, the initial layer having the predetermined primary orientation of the seed crystal. During solidification after the superliquidus scan, the initially-deposited layer acquires its crystallographic texture from the seed crystal. Since cooling rates of the melted layer may be with the range of $10^{3\circ}$ C./second to $10^{4\circ}$ C./second, the gamma prime phase does not form during cooling. Consequently, because the ordered $Ni_3Al$ phase is absent, the supersaturated gamma phase layer is prone to recrystallization. In order to preserve the desired primary orientation, the additional layer is re-scanned at subsolvus temperatures (temperatures below the gamma prime solvus) for a sufficient time to precipitate a few percent of the gamma prime as particles within the deposited layer's gamma phase matrix. The presence of coherent, ordered $Ni_3Al$ solid solution precipitates within the gamma phase matrix stabilizes the primary orientation within the deposited layer. When the alloy is exposed to subsolvus temperatures within about 300° C. of the gamma prime solvus, the time required to nucleate and grow a few percent of the gamma prime phase is a few seconds.

The method further includes depositing an additional thin layer of metal powder over the initial layer, scanning an additional pattern with the laser beam into the deposited additional metal powder to at least partially melt or sinter at least a portion of the deposited additional metal powder, re-scanning the additional pattern with the laser beam to superliquidus re-melt deposited additional metal powder and a portion of the initial layer to form a successive layer. The additional layer is then re-scanned with the beam power set for subsolvus temperatures to precipitate sufficient gamma prime to stabilize the predetermined primary orientation in the additional layer. Successive layers are deposited by repeating the steps of depositing additional metal powder, scanning the additional pattern, and re-scanning the additional pattern at superliquidus temperatures, and re-scanning the additional pattern at subsolvus temperatures until a final shape of the component is achieved.

Figure 1:
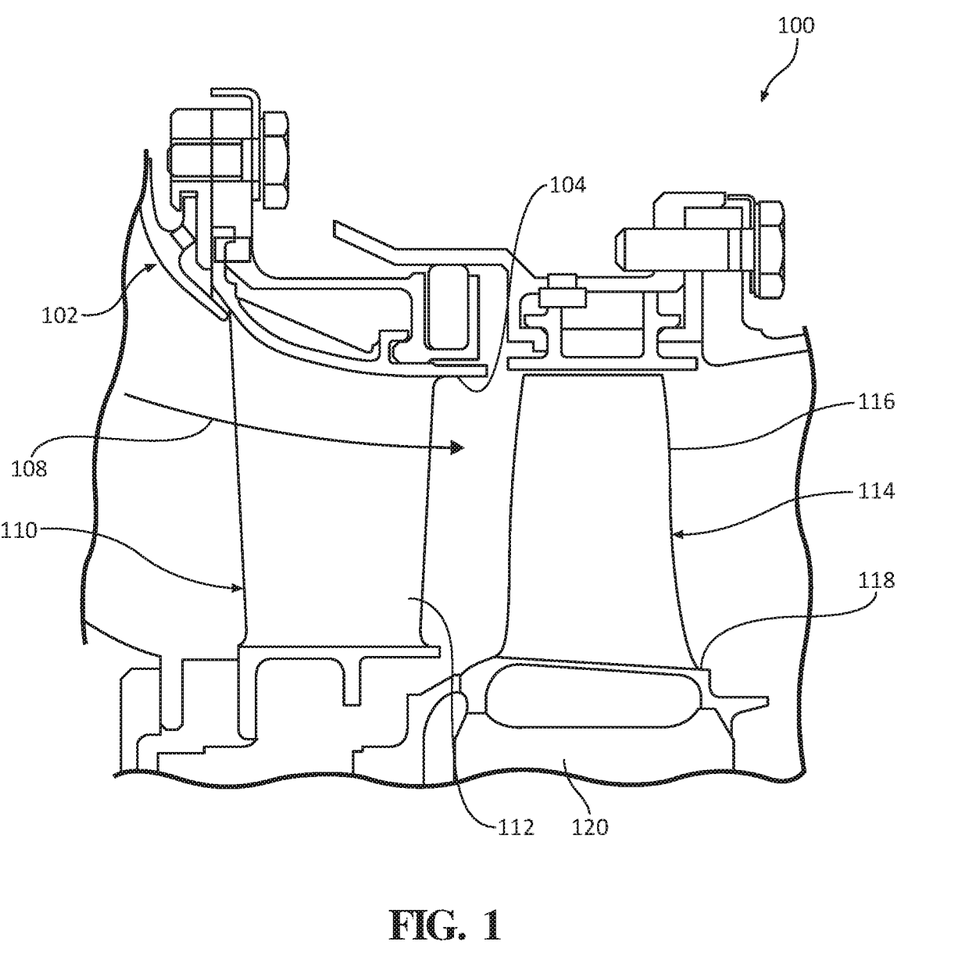
FIG. 1 is a partial cross-section view of a turbine section of an air turbine engine, according to an embodiment of the present disclosure.

As noted briefly above, the methods described herein are useful for fabricating gas turbine engine components. For example, components, such as turbine blades and vanes of gas turbine engines, which may be exposed to high temperature gases may be formed from nickel-base superalloy in the manner discussed herein. FIG. 1 is a simplified cross-sectional view of a portion of a turbine section 100 of a gas turbine engine. The turbine section 100 includes gas turbine engine components which may be fabricated according to the methods described herein. Generally, the turbine section 100 includes a housing 102 and an annular duct wall 104, which together form a mainstream hot gas flow path 108 receiving combustion gases from a combustion section (not shown) of the gas turbine engine. The hot gases from the flow path 108 are directed along the turbine section 100 via at least one stator assembly 110, which includes stator vanes 112, toward at least one turbine rotor assembly 114. The turbine rotor assembly 114 includes rotor blades 116, which are each mounted to a rotor platform 118, which in turn is coupled to a turbine disk 120. The turbine disk 120 is coupled to a shaft (not shown). Thus, the energized gases flow through the flow path 108 and over the row of stator vanes 112 to impinge against the rotor blades 116 to thereby spin turbine rotor assembly 114 at a high velocity. As a result, the energized gases are further accelerated to create a thrust when exhausted out the exhaust section (not shown).

Because the components of engine 100 are subjected to extreme high temperatures and pressures during engine operation, materials with directionally solidified microstructures or single crystal microstructures have been used in the manufacture thereof. In this regard, alloys capable of forming materials having such microstructures, such as nickel-base superalloys, CMSX4, CMSX486, SC180, which are used with a single crystal microstructure and MarM247 which is used with a directionally solidified microstructure, and the like. In order to optimize the mechanical properties of these materials, it has been important to consider the temperature and the presence of phases during component manufacture. Specifically, phases present within nickel-base gamma-gamma prime superalloys are dependent upon temperature and alloy composition.

Figure 2:
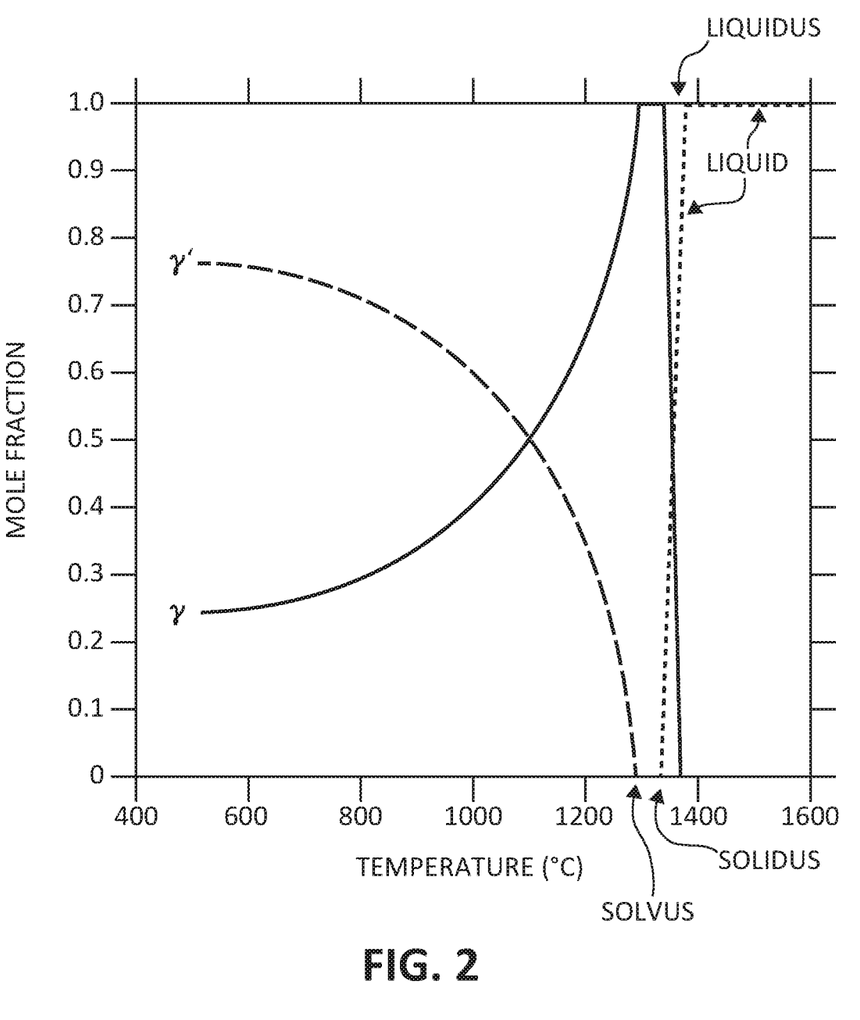
FIG. 2 is a graph depicting equilibrium phases in a CMSX4 superalloy as a function of temperature.

FIG. 2 is a graph showing equilibrium phases in CMSX4 superalloy as a function of temperature. As shown in the graph, the liquidus of CMSX4 superalloy is about 1390° C. and the solidus of CMSX4 superalloy is about 1350° C. CMSX4 superalloy is fully molten at superliquidus temperatures (above about 1380° C.), and partially molten at subliquidus temperatures (i.e., between about 1380° C. and the solidus temperature, 1350° C., where the alloy is fully solid). Supersolvus temperatures, in the range of 1300° C. to 1350° C. for the CMSX4 alloy, are above the gamma prime solvus, and in such range, the alloy microstructure includes the gamma nickel solid solution phase while the gamma prime phase is absent. When in the subsolvus temperatures for the CMSX4 superalloy (for example, below 1300° C.), both gamma and gamma prime phases are present. The supersolvus temperature zone is absent for some superalloys; i.e., the gamma prime solvus temperature is the same as the solidus. Alloys without a supersolvus temperature zone include MarM247 and CMSX486.

Figure 3:
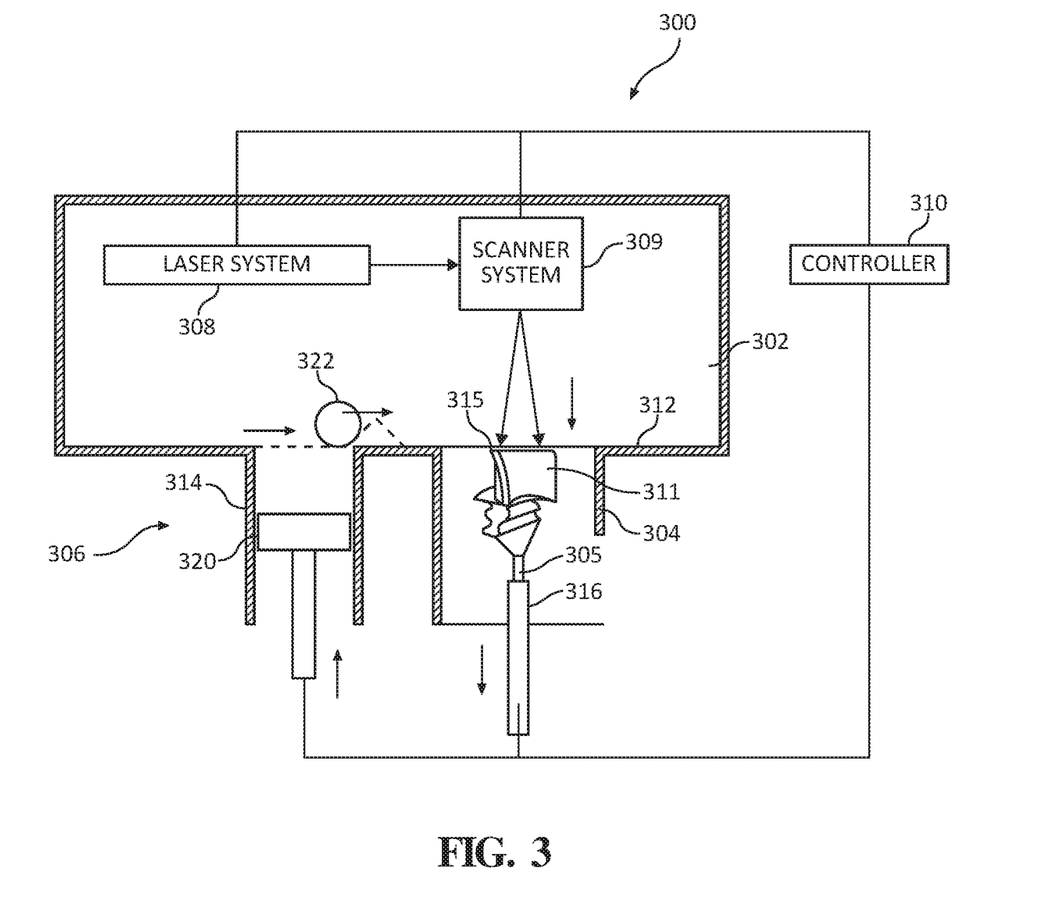
FIG. 3 is a simplified schematic of a laser metal melting system, according to an embodiment of the present disclosure.

In order to optimize the mechanical properties of these materials, the materials may be used in additive manufacturing processes using a direct laser metal melting system, such as illustrated in FIG. 3. The system 300 may include a powder delivery system 306, a laser system 308, and a scanner system 309 disposed in a chamber 302 configured to be maintained at a predetermined temperature and atmosphere, such as those suitable for laser metal melting and additive manufacturing. The floor 312 of the chamber 302 has various side cavities, for example, a powder source container 314 in one section and a fabrication well 304 in another section.

The powder delivery system 306 delivers metal powder to the fabrication well 304 and, in this regard, includes a powder source container 314, a delivery piston 320, and a delivery mechanism 322. In an embodiment, metal powder may be disposed in the powder source container 314. The powder delivery piston 320, which is disposed in the powder source container 314, moves upwardly a desired distance relative to the floor 312 of the chamber 302 to lift a volume of the powder toward the floor 312 and out of the container 314. The opening into the powder source container 314 alternatively may be formed on a side or a bottom wall of the chamber 302, in which case a valve may be included in the opening to control a rate and/or amount of metal powder provided to the fabrication well 304. The delivery mechanism 322 is configured to transfer a portion of the powder to the fabrication well 304 by moving the lifted volume of metal powder along the floor 312 of the chamber 302 and toward the fabrication well 304. The delivery mechanism 322 may be a roller (as shown) or alternatively, a scoop, screed, a delivery line or another mechanism capable of transferring metal powder from one area to another.

As alluded to above, the transferred metal powder is used in the fabrication of a component. In this regard, the fabrication well 304 includes a piston 316 configured to support a seed crystal 305 and a workpiece 311 made using the seed crystal. The seed crystal 305 is used as a foundation for manufacturing the component. A motor (not shown) may be coupled thereto to controllably move the support piston 316 (and hence, a target surface 315 of the workpiece 311) through the fabrication well 304 relative to the floor 312 of the chamber 302. A controller 310 is operatively coupled to the motor to provide commands to move the support piston 316 a predetermined distance downward relative to the floor 312 of the chamber 302. In this way, each layer of powder delivered to the target surface of the workpiece 311 formed by each pass of the delivery mechanism 322 can define a thickness of a layer of metal powder to be added to the workpiece 311.

The laser system 308 is configured to generate a laser beam for melting the deposited metal powder on the target surface of the workpiece. In an embodiment, the laser beam system 308 may output a power in a range of about 50 to about 500 watts, and/or the laser beam system 308 may be configured to produce a laser spot having a diameter in a range of about 0.05 mm (millimeters) to about 1.0 mm. In another embodiment, the laser beam system 308 may be provided at a wavelength in a range of about 1.06 microns. In still another embodiment, the laser beam system 308 may implement solid state lasers, such as Nd:YAG laser and Ytterbium fiber laser.

To ensure that an intended target surface and/or or workpiece shape results, the scanner system 309 is included to direct the laser beam at desired locations according to a predetermined pattern that corresponds to a cross-section of the resulting component. The scanner system 309 may include one or more reflective surfaces (e.g., mirrors) and/or optical devices (e.g., lenses and/or prisms) to deflect the laser beam to desired locations on the target surface.

The powder delivery system 306, laser system 308, and scanner system 309 each communicate with the controller 310, which may be programmed to provide commands thereto. For example, the controller 310 commands relating to the delivery of a predetermined amount of metal powder to the fabrication well 304, and/or to the movement of the support piston 316 to create a space for receiving the metal, and/or to provide a laser beam having a particular laser output power and a laser spot diameter required for superliquidus melting or subsolvus heat treatment at the scanned target surface, and/or to deflect the laser along a path in the shape of the predetermined pattern on the target surface of the powder bed.

A temperature sensor, for example, an optical temperature sensor (not shown), may be included within or outside chamber 302, to measure the temperature of the metal being melted or heat treated by the laser beam at locations in the scan pattern. One type of sensor is an infrared camera. The controller 310 may utilize scan temperature information to adjust laser power, beam focus, or adjust the scan parameters (e.g., the speed of the scan) as necessary to maintain the metal temperature within specified temperature ranges for superliquidus melting and subsolvus heat treatment. Alternatively the controller 310 may calculate the temperature of the metal heated by the beam as a function of process parameters such as laser power, focused beam diameter, velocity of the laser beam on the scan surface, and other parameters.

Figure 4:
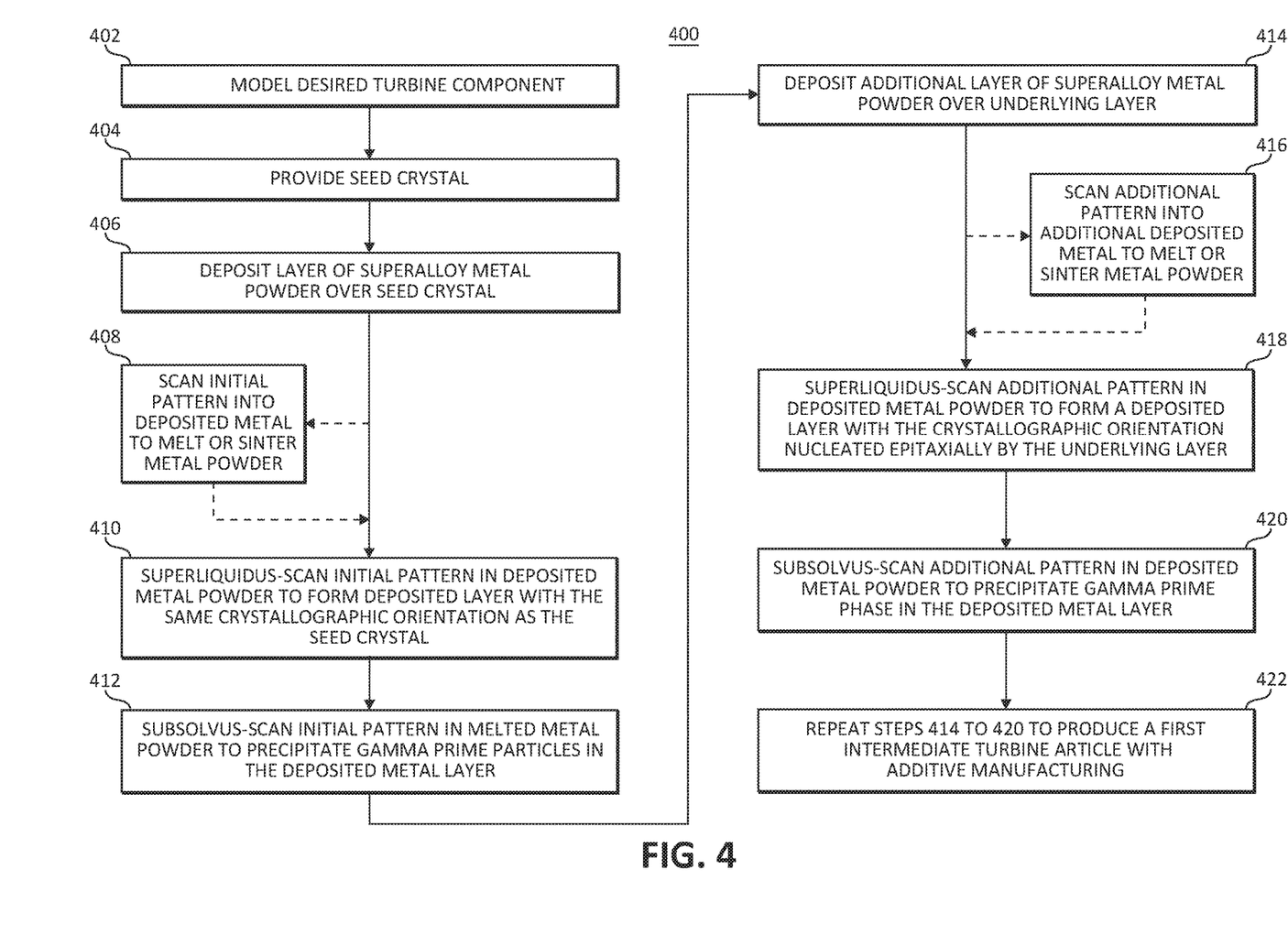
FIG. 4 is flowchart illustrating a method for producing an intermediate article with additive manufacturing.

In any case, taking into account the equilibrium phases of nickel-base gamma-gamma prime superalloys, in order to optimize the mechanical properties of these materials, a method 300 for manufacturing components having such directionally solidified or single crystal microstructures, as depicted in a flow diagram illustrated in FIG. 4, may be employed. Method 400 includes modeling a desired component at step 402. In an embodiment, a model, such as a design model, of a component, for example, a turbine component is obtained or alternatively, designed using suitable software programs, such as a computer aided design (CAD) software, including external and internal surfaces making up the component. In an embodiment, the component is a turbine component and includes three-dimensional (3D) representations of an airfoil, a platform, channels, openings, and the like. In another embodiment, two-dimensional (2D) representations are used, and may be implemented by using 2D cross-sectional slices that may in aggregate form the 3D component.

A seed crystal having at least a predetermined primary orientation is provided at step 404. For example, the seed crystal may be disposed on the piston 316 in the fabrication well 304. "Predetermined primary orientation" refers to a direction perpendicular to a crystal lattice plane of the seed crystal (denoted as a [001] direction). It will be appreciated that the particular growth direction may be selected based, in part, on a desired resultant property and/or on a desired orientation of the component. In an embodiment, a desired orientation may be in a direction that provides a component with improved creep strength. In another embodiment, the component may be a turbine blade having an airfoil extending along a first axis, which may be disposed in a first primary axis direction, so that when the airfoil is grown from the seed crystal, growth may occur in a [001] direction substantially parallel to the first primary axis. The seed crystal includes a single crystal microstructure and may have a [001] crystallographic direction in the vertical direction—for example, in the context of a turbine blade, parallel to the turbine blade axis.

Although noted as having the predetermined primary orientation, the seed crystal for use in forming single crystal microstructures may also include a predetermined secondary orientation (which may be defined as a second direction of a crystal lattice of the seed crystal). In an embodiment, the predetermined secondary orientation may be orthogonal to the primary orientation and hence, denoted as a [100] direction. In the embodiment described above in which the turbine blade has an airfoil extending along the first axis, an attachment section of the turbine blade may extend orthogonally relative to the first axis and along a second primary axis of the seed crystal lattice. Such orientation may provide improved creep and fatigue strength properties of the component.

In an embodiment, the seed crystal may be a material conventionally employed for manufacturing engine components and may be selected based on desired strength capabilities of the component. For example, in embodiments in which the component is fabricated as having a multi-grained directionally solidified microstructure, superalloys including grain boundary strengthening elements, such as hafnium, carbon or boron, may be included, such as MAR-M-247. In another embodiment, the seed crystal is used in the manufacture of directionally solidified components and includes several grains. For example, the grains may include the predetermined primary orientation (e.g., [001]) and random secondary orientations. In still another embodiment, alloys such as SC180, CMSX4, and CMSX486 are used to fabricate a component having a single crystal microstructure. In this regard, the seed crystal 404 for single crystal components is formed from a crystal with just one grain with the predetermined primary orientation.

At step 406, metal powder is deposited over the seed crystal. For example, the metal powder may be disposed in the chamber 302, a volume of the metal powder may be lifted up by the piston 320, and a volume of the metal powder may be transferred into the fabrication well 304 via the delivery mechanism 322 over the seed crystal. In an embodiment, the metal powder is substantially similar or identical in composition (e.g., >99% similarity) to the seed crystal. For example, the metal powder may be the same composition as the superalloy or alloy of the seed crystal, except in powder form. The powder may be made up of particles having an average diameter in a range of about 5 microns to about 50 microns. In other embodiments, the particle diameters may be larger or smaller than the aforementioned range. The deposition of the metal powder may include disposing the metal powder around the seed crystal to form a powder bed. In an embodiment, the powder bed may be a single layer of metal powder of a thickness in a range of about 15 microns to about 50 microns. For example, the layer of metal powder may be about 25 microns thick. In other embodiments, the thickness of the metal powder layer may be greater or less than the aforementioned range.

Optionally, a portion of the metal powder is initially sintered or melted at step 408. For example, an energy source provides heat to sinter or melt the deposited metal powder. The energy source may be provided by a laser 308, or electron beam, in an embodiment, programmed by the controller to move across a target surface of the metal powder layer along a path. According to an embodiment in which a laser system is used, the laser system is set at a first set of modulation parameters, for example, in a range of about 50 watts to about 300 watts. In another embodiment, the laser beam may be configured to produce a laser spot having a diameter in a range of about 0.05 mm (millimeters) to about 1.0 mm. In an embodiment, the energy source is used to scan a pattern into the deposited metal powder, for example, via scanning system 309. The pattern may correspond to a horizontal slice (for example, a cross section taken along a horizontal plane) of the component to be fabricated. In other embodiments, the pattern may be a cross section taken along a different plane through the component. The energy source may travel in a raster-scan fashion, a vector fashion, a zig-zag fashion or a combination of scan fashions.

No matter if step 408 is performed, the deposited powder and a portion of the seed crystal is melted at superliquidus temperatures to form an initial layer at step 410. By melting the material at superliquidus temperatures, the resulting initial layer acquires the crystallographic orientation of the seed crystal. For example, the seed crystal may be positioned in the predetermined primary orientation. In a configuration in which the resulting component is to be made up of a directionally solidified material, the deposited powder forming the initial layer may include a plurality of grains, which are arranged into crystal structures having the predetermined primary orientation [001]. In an embodiment in which the component is made up of a single crystal, the deposited powder is formed into an initial layer including a single grain having the predetermined primary orientation. In an embodiment in which the component is made up of a single crystal having a desired primary and secondary crystal orientation, the deposited powder is formed into an initial layer having a single grain having the predetermined primary orientation and predetermined secondary orientation, where the desired secondary orientation is obtained by positioning the seed crystal in both the predetermined primary orientation and predetermined secondary orientation.

To provide the remelting at superliquidus temperatures, the laser system, for example, system 308, is set at a second set of modulation parameters for superliquidus melting before remelting of step 410 occurs at the target surface. The second set of modulation parameters may be different from the first set of modulation parameters, for example, in power, beam diameter, and the like. In an example, the second set of modulation parameters may include a laser power that is greater than the laser power of the first set of modulation parameters and may be in a range of about 100 watts to about 500 watts. In another embodiment, the second set of modulation parameters additionally or alternatively may include a laser focal size or scan speed that is different from that of the first set of modulation parameters.

After scanning the thin (e.g., 25 micron thick) deposited layer with the laser beam set for superliquidus melting temperatures, the molten superalloy is cooled very rapidly, at rates in the range of $10^{3\circ}$ C./second to $10^{4\circ}$ C./second. Under these rapid cooling conditions, the gamma prime phase doesn't have time to form (i.e., nucleate and grow).

Consequently, rapid cooling from superliquidus temperatures results in epitaxial growth of a supersaturated gamma phase layer that is prone to recrystallization. In order to avoid this problem, at step 412, the initial layer is heat treated with the laser at subsolvus temperatures to precipitate particles of the gamma prime solid solution phase, in order to preserve the desired primary orientation. By exposing the material to subsolvus temperatures within about 250° C. to about 300° C. of the gamma prime solvus, the time required to nucleate and grow a few percent of the gamma prime phase is a few seconds. For example, exposure of the deposited layer to high subsolvus temperatures (e.g., in the range of about 1000° C. to about 1280° C. for the CMSX4 alloy) for a few seconds permits gamma prime particles to begin to form.

According to an embodiment, the initial layer is heated at subsolvus temperatures (for example, temperatures below the gamma prime solvus) for a sufficient time to precipitate at least a few percent (for example, up to about 5%) of the gamma prime as particles within the initial layer's gamma phase matrix. For example, the heating at subsolvus temperatures is performed for about 1 to 3 seconds. The presence of coherent, ordered $Ni_3Al$ solid solution precipitates within the gamma phase matrix stabilizes the primary orientation within the initial layer and inhibits recrystallization and growth of grains with undesirable crystallographic orientations.

The method 400 further includes depositing additional metal powder over the initial layer at step 414. A thickness of the layer of additional metal powder may be in a range of about 15 microns to about 50 microns. In another embodiment, the thickness of the additional metal powder layer may be greater or less than the aforementioned range. The method 400 also includes, at least partially melting or sintering at least a portion of the deposited additional metal powder in step 416, re-melting the deposited additional metal powder and a portion of the initial layer at superliquidus temperatures to form a successive layer in step 418, and heat treating the successive layer at subsolvus temperatures in step 420 to precipitate sufficient gamma prime to stabilize the predetermined primary orientation in the successive layer. Step 416 is optional, in which case, step 418 is performed after step 414. In step 422 more successive layers are deposited by repeating steps 414 to 420, and optionally step 416, until a final shape of the component is achieved.

In an embodiment, patterns may be rescanned by the laser. For example, when the controller determines that a scan may not have produced required superliquidus melting conditions or subsolvus heat treating conditions, the controller may have the laser system perform the pattern scan again.

Figure 5:
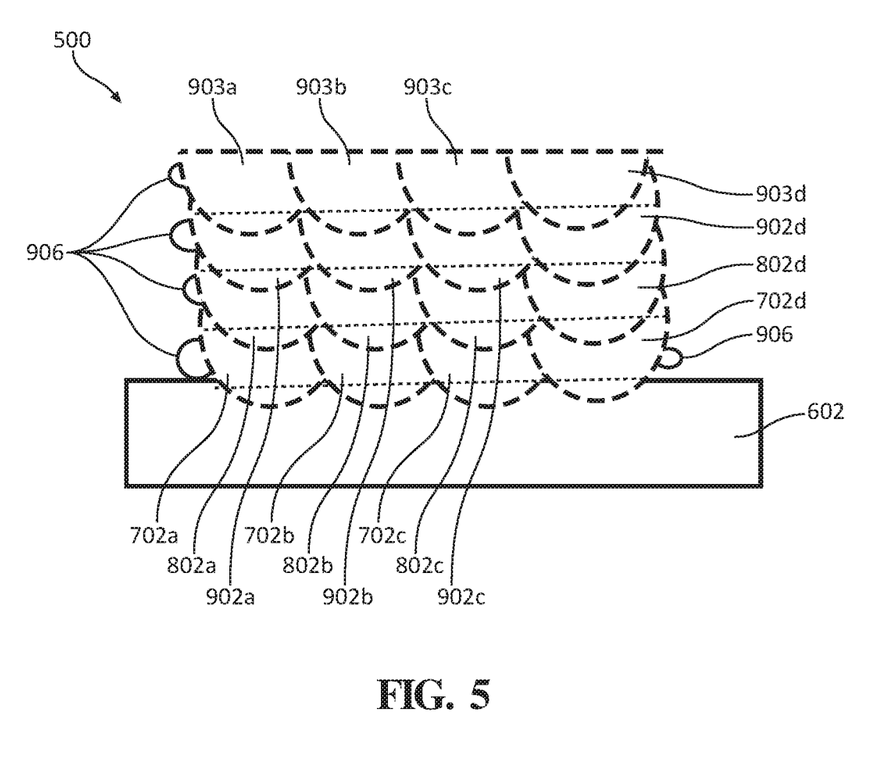
FIG. 5 is a simplified cross section view of a portion of an intermediate article, according to an embodiment.

Turning now to FIG. 5, a cross section view of a first intermediate article 500 produced by additive manufacturing is provided, according to an embodiment. First intermediate article 500 includes a seed crystal 602, an initial layer 702, and successive layers 802, 902, 903 disposed over initial layer 702. Each of layers 702, 802, 902, 903 is made up of individual scan portions 702*a-d*, 802*a-d*, 902*a-d*, 903*a-d*. In particular, when the superliquidus melted metal melted by the laser beam solidifies, cools, and is microstructurally stabilized by the subsolvus heat treatment scan, a portion of the component is formed, for example, yielding portions 702*a-d*, 802*a-d*, 902*a-d*, 903*a-d*. In order to avoid microstructure defects, the combination of the power of the energy beam and speed of scanning is controlled. In particular, the energy beam should provide a small molten pool that fully melts the deposited powder layer and a portion of the thickness of the previously deposited layer. The pattern of scans must overlap sufficiently to avoid leaving unmelted powder particles between adjacent scan passes, as shown in FIG. 5. For example, as illustrated in FIG. 5, portion 903*d* includes material from adjacent portion 903*c* and portion 902*d*. If the energy beam passes in the scan pattern are not sufficiently overlapped, unmelted powder particles may be present within the scanned pattern, which can result in the growth of powder particle nucleated stray grains within the component to promote a reduction in mechanical properties. Partially melted powder particles 906 bonded to the edge of article 400 are unavoidable during additive manufacturing. These particles 906 may be removed in a later operation. Growth of these particles 906 into the scanned pattern of the article 400 is inhibited by the presence of the ordered gamma prime precipitates produced during the subsolvus heat treatment of each scanned layer within article 500.

Figure 6:
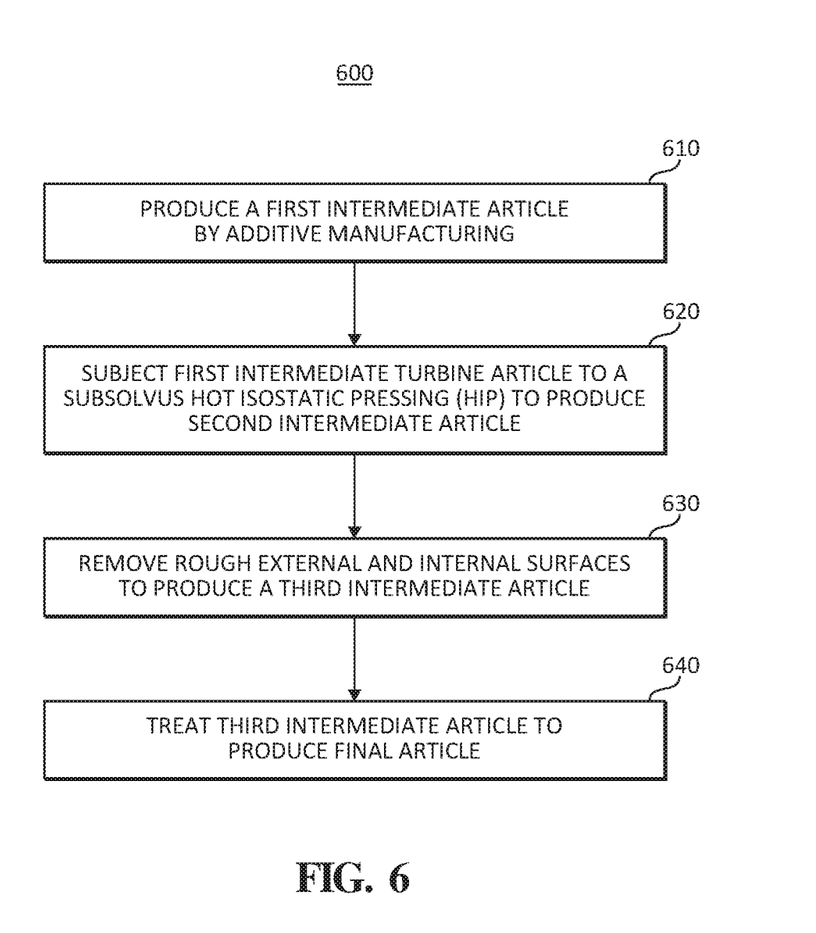
FIG. 6 is a flowchart illustrating a method of producing a final article by additive manufacturing.

The first intermediate article may be further treated to thereby produce a final article. With reference now to FIG. 6, a flow diagram of a method 600 for producing a final article by additive manufacturing is provided. The final article may be a turbine component, such as a blade, a vane, a segment of a turbine shroud, a segment of a combustor, or any other component, for example those included in turbine engine 100.

In an embodiment, the first intermediate article is produced by additive manufacturing at step 610. For example, the first intermediate article is produced by implementing the method 400 as shown in FIG. 4. At step 620, the first intermediate article produced in step 410 is then subjected to hot isostatic pressing (HIP) at high subsolvus temperatures to provide a second intermediate article. The HIP process may be performed at any subsolvus temperature, pressure, and time such that a compacted solid having a minimal amount of internal porosity and cracking is formed. Specifically, as a result of the HIP process, internal porosity and cracking that was not connected to a surface is substantially minimized. Suitable processing temperatures include those within a range of about 1000° C. to a temperature at or below, the gamma prime solvus temperature. For example, for a CMSX4 alloy, which has a gamma prime solvus temperature of about 1300° C., the HIP processing temperature may be below about 1280° C. Suitable pressures includes those in a range of about 1 ksi to about 25 ksi, and suitable time periods include about 1 to about 10 hours. In another embodiment, the HIP subsolvus processing temperature, pressure, and time may be greater than or less than the ranges previously described. Additionally, the HIP process is useful for reducing or eliminating residual stresses in the component. The presence of the gamma prime particles within all of the additive layers during the HIP process inhibits the growth of misoriented grains from the rough surface and from surface-bonded partially melted powder particles and recrystallization, which is another mechanism for formation of misoriented grains.

Porosity or cracks that are connected to the surface of the component typically are shallow and can be removed with subsequent processing. For example, at step 630, the rough external and internal surfaces are removed from the second intermediate article to produce a third intermediate article. For example, the roughness and microcracking may be minimized or eliminated by conventional vibratory finishing. In an embodiment, the component is submersed in an abrasive media for sufficient time to remove a thin (e.g., 10 to 30 microns) layer of material from its external surface. In another embodiment, conventional abrasive flow machining may be used to remove roughness and microcracking from internal passages of the component. In still another embodiment, the surface layer is chemically converted to a diffusion nickel-aluminide coating and the coating is chemically stripped from the surfaces, as taught by U.S. Pat. Nos. 8,506,836, 9,039,917, or 9,175,568. Steps 620 and 630 may be performed in a reverse order, in an embodiment.

At step 640, the third intermediate article is treated to produce the final article. It will be appreciated that the performance of step 640 and the particular treatment selected is based on the intended use and shape of the final article. For final articles intended as turbine components, manufacturing operations in step 640 are those typically applied to turbine components produced with alloys such as MarM247, CMSX486, CMSX4 and SC180, in order to improve the high temperature creep strength properties of the resulting nickel-base superalloy component. For example, the manufacturing operations may include supersolvus solution heat treatments for alloys, such as CMSX4 and SC180, that have a single phase gamma temperature range above the gamma prime solvus. For alloys, such as MarM247 or CMSX486, that cannot be fully solution heat treated because the gamma prime solvus coincides with the onset of melting, subsolvus heat treatments can be used. For alloys, such as CMSX4 and SC180, in which recrystallized grains might be formed in a component during a supersolvus heat treatment, subsolvus heat treatments can be used. In another example, a two-step heat treatment is performed in order to develop a gamma-gamma prime microstructure with a more optimized distribution of gamma prime particle sizes. For example, the two-step heat treatment could comprise a subsolvus heat treatment step (e.g., at 1275 C), which partially solutions the gamma prime), rapid inert gas cooling to form an array of cuboidal gamma prime particles with a sizes in the range of 0.4 to 0.5 microns, and a gamma-prime precipitation heat treatment at a lower temperature (e.g., 870 C), which precipitates additional gamma prime with particle sizes less than 100 nanometers.

In embodiments in which the final article is a turbine blade, deposition of oxidation resistant coatings to designated external and internal surfaces of the component may be included. Suitable materials for the oxidation resistant coatings include, but are not limited to diffusion nickel-aluminide, platinum-nickel aluminide, and NiCoCrAlY. These materials may additionally or alternatively be used as bond coatings for thermal barrier coatings made up of yttria stabilized zirconia or another suitable composition deposited over the oxidation resistant coating. In another embodiment, the component may be machined to desired dimensional requirements.

By employing the novel scanning, superliquidus melting and subsolvus heat treating steps described above, components having single crystal and/or directionally solidified microstructures can now be formed using a laser melting system. Additionally, the improved fabrication methods may be relatively less expensive and simpler to perform as compared to conventional investment casting methods. Moreover, the fabrication method may be employed to form many different components. Specifically, although the inventive subject matter is, for convenience of explanation, depicted and described as being implemented to manufacture components for gas turbine engine, the inventive subject matter can be implemented to manufacture components for various other types of systems that include components including single crystal or directionally solidified structures.

What is claimed is:

1. A method of fabricating a component having a directionally solidified microstructure or a single crystal microstructure, the method comprising the steps of:
    depositing a nickel-base superalloy powder with a composition comprising gamma nickel solid solution and gamma prime solid solution phases onto a seed crystal, the seed crystal having a predetermined primary orientation;
    melting the deposited nickel-base superalloy powder and a portion of the seed crystal at a superliquidus temperature to form an initial layer, the initial layer is rapidly cooled so that it comprises a supersaturated gamma phase and has the predetermined primary orientation;
    heat treating the initial layer for a few seconds at a high subsolvus temperature to precipitate a few percent of the gamma prime solid solution phase as particles within the supersaturated gamma phase;
    depositing additional nickel-base superalloy powder over the initial layer;
    melting the deposited additional nickel-base superalloy powder in combination with a portion of the initial layer at a superliquidus temperature to form a successive layer, the successive layer is then rapidly cooled so that it comprises the supersaturated gamma phase and has the predetermined primary orientation;
    heat treating the successive layer for a few seconds at a high subsolvus temperature to precipitate a few percent of the gamma prime solid solution phase as particles within the supersaturated gamma phase; and
    repeating the steps of depositing additional nickel-base superalloy powder, melting the deposited additional nickel-base superalloy powder and the portion of the successive layer at the superliquidus temperature, and heat treating the successive layer at the subsolvus temperature to form the component.

2. The method of claim 1, wherein a total thickness of the successive layer is in a range of about 15 microns to about 50 microns.

3. The method of claim 1, further comprising:
    at least partially melting the deposited nickel-base superalloy powder and bonding the deposited nickel-base superalloy powder to the seed crystal, before fully melting the deposited nickel-base superalloy powder and the portion of the seed crystal at the superliquidus temperature to form the initial layer.

4. The method of claim 3, further comprising:
    at least partially melting the deposited additional nickel-base superalloy powder to bond it to the initial layer, before melting the deposited additional nickel-base superalloy powder and the portion of the initial layer at the superliquidus temperature to form the successive layer.

5. The method of claim 1, wherein the nickel-base superalloy powder comprises 50% to about 70% gamma prime solid solution phase by volume.

6. The method of claim 1, wherein the steps of melting the deposited nickel-base superalloy powder at the superliquidus temperature and heat treating the deposited layer at the subsolvus temperature are performed using a laser beam or an electron beam.

7. The method of claim 1, wherein a thickness of a layer of the deposited additional metal powder is in a range of about 15 microns to about 30 microns.

8. The method of claim 1, wherein:
the seed crystal comprises a single crystal superalloy seed and has a predetermined secondary orientation that is orthogonal relative to the predetermined primary orientation; and
the successive layer comprises a single grain and has the predetermined primary orientation and the predetermined secondary orientation, after the step of melting the deposited additional nickel-base superalloy powder and a portion of the initial layer at a superliquidus temperature to form a successive layer.

9. The method of claim 1, further comprising hot isostatically pressing the component at a subsolvus temperature.

10. The method of claim 9, wherein the hot isostatically pressing is performed at a subsolvus temperature in a range of about 1000° C. to about 1280° C., at a pressure in a range of about 1 ksi to about 25 ksi, and for a time in a range of about 1 hour to about 10 hours.

11. The method of claim 9, further comprising performing vibratory surface finishing, abrasive flow machining, or chemical surface finishing to remove up to 30 microns from one or more of an external surface or an internal surface of the component.

12. The method of claim 11, further comprising subjecting the component to a solution heat treatment and to a precipitation heat treatment to impart a two-phase gamma-gamma prime microstructure to the component.

13. The method of claim 11, further comprising depositing a coating over the surfaces of the component.

14. The method of claim 1, wherein the subsolvus heat treatment of the initial layer and subsequent layer for the few seconds is for 1 to 3 seconds.

15. The method of claim 1, wherein the few percent of the gamma prime solid solution phase particles precipitated within the supersaturated gamma phase is 1 to 5 percent.

16. The method of claim 1, wherein the high subsolvus temperature is within about 300° C. of the gamma prime solvus.

* * * * *